United States Patent [19]
Partlo et al.

[11] Patent Number: 5,233,460
[45] Date of Patent: Aug. 3, 1993

[54] METHOD AND MEANS FOR REDUCING SPECKLE IN COHERENT LASER PULSES

[75] Inventors: William N. Partlo, Berkeley; William G. Oldham, Orinda, both of Calif.

[73] Assignee: Regents of the University of California, Oakland, Calif.

[21] Appl. No.: 827,941

[22] Filed: Jan. 31, 1992

[51] Int. Cl.$^5$ .................. G02B 27/28; G02B 27/48
[52] U.S. Cl. .................................. 359/247; 359/487; 359/495
[58] Field of Search ............... 359/247, 256, 264, 487, 359/495, 279, 246, 483; 372/106, 700

[56] References Cited

U.S. PATENT DOCUMENTS

| | | | |
|---|---|---|---|
| 3,430,048 | 2/1969 | Rubenstein . | |
| 3,447,856 | 6/1969 | DeLange . | |
| 3,501,222 | 3/1970 | Herriott et al. | 359/247 |
| 3,501,223 | 3/1970 | Rack | 359/247 |
| 3,633,999 | 1/1972 | Buckles . | |
| 4,053,763 | 10/1977 | Harney | 359/247 |
| 4,264,135 | 4/1981 | Lang | 359/264 |
| 4,511,220 | 4/1985 | Scully | 359/495 |
| 4,656,358 | 4/1987 | Divens et al. . | |
| 4,685,807 | 8/1987 | Picard | 356/401 |
| 4,744,615 | 5/1988 | Fan et al. . | |
| 5,058,973 | 10/1991 | Refregier et al. | 372/700 |

FOREIGN PATENT DOCUMENTS

62-133788  6/1987  Japan .................. 372/700

OTHER PUBLICATIONS

Pol et al, "Excimer Laser-Based Lithography: A Deep Ultraviolet Wafer Stepper," SPIE vol. 633, Mar. 1986, pp. 6–16.
Jain, "Advances in Excimer Laser Lithography," SPIE vol. 710, Mar. 1986, pp. 35–42.
Ruckle et al, "Computerized Wavelength Stabilized 248.4 nm Excimer Laser for Stepper," SPIE vol. 922, Mar. 1988, pp. 450–453.
Sandstrom, "Measurements of Beam Charac. Relevant to DUV MICRO. on a KrF Excimer Laser," SPIE vol. 1264, Mar. 1990, pp. 507–519.
Cullis et al, "A Device for Laser Beam Diffusion and Homogenisation," J. Phys. E:Sci. Instrum., vol. 12, 1979.
Taback, "Speckle Supression Apparatus," Applied Optics, vol. 28, No. 22, No. 15, 1989, p. 4947.

*Primary Examiner*—Martin Lerner
*Attorney, Agent, or Firm*—Townsend and Townsend Khourie and Crew

[57] ABSTRACT

A train of coherent laser output pulses with reduced speckle is generated by providing laser pulses having a first polarization and a coherence length, splitting each pulse in the input laser pulses to provide a first pulse train including a first series of output pulses of the first polarization in output pulses and a second pulse train, and rotating polarization and delaying the second pulse train. The second pulse train is then split to provide a second series of output pulses having a different polarization than the first series of output pulses and a third series of output pulses having a delay length greater than the laser coherence length thereby providing a train of coherent laser output pulses including the first series of output pulses interleaved with the second series of output pulses and the third series of output pulses. The train of coherent laser output pulses can again be split and delayed with polarization rotation to generate a second train of coherent laser output pulses. To further reduce speckle in the generated train of coherent laser output pulses, the optics for delaying and rotating the polarization can be so arranged that each pulse in the train exits the system in a slightly different position and at a slight different angle whereby the speckle pattern produced by the interaction of the beam with scatterers is uncorrelated.

14 Claims, 2 Drawing Sheets

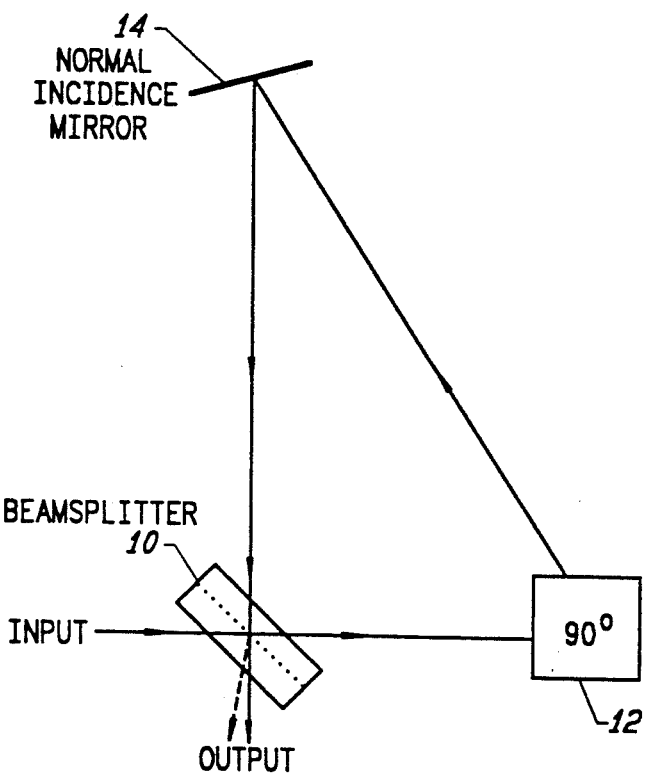
FIG. 1
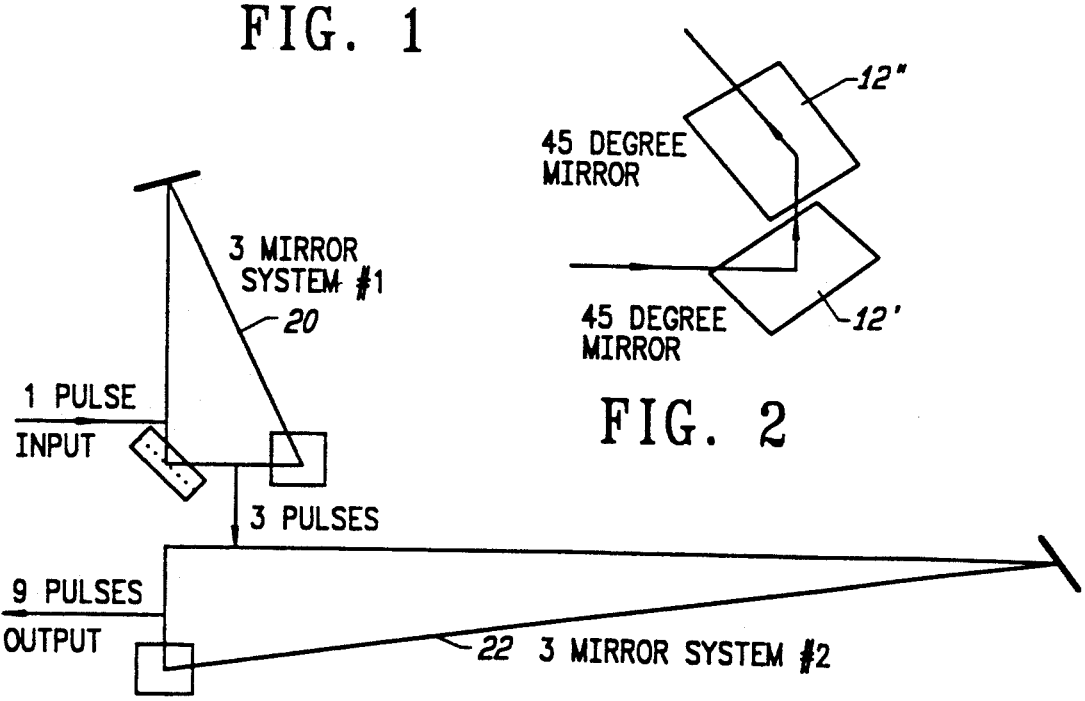
FIG. 2
FIG. 3

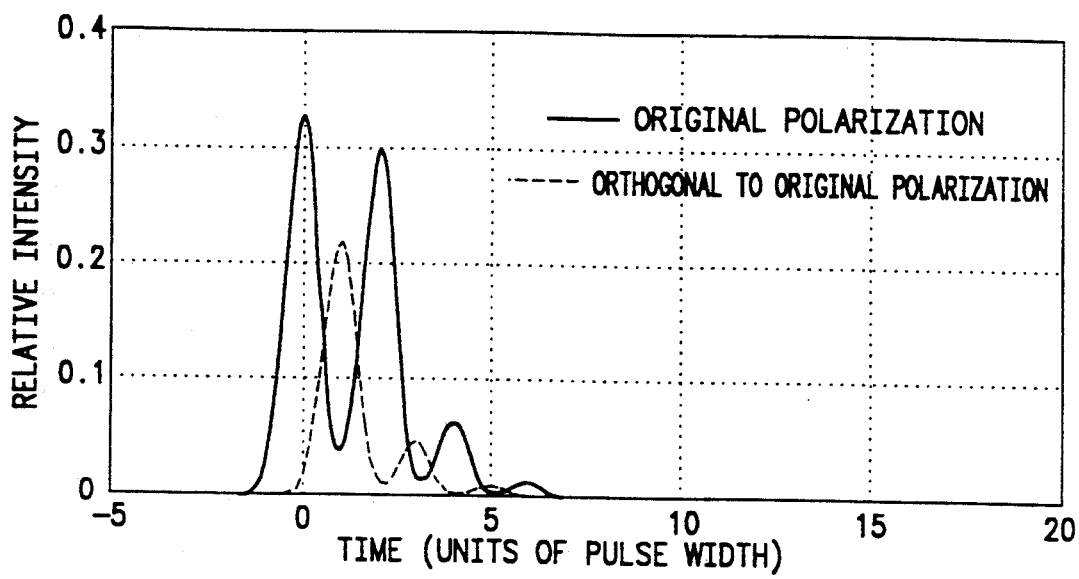
FIG. 4
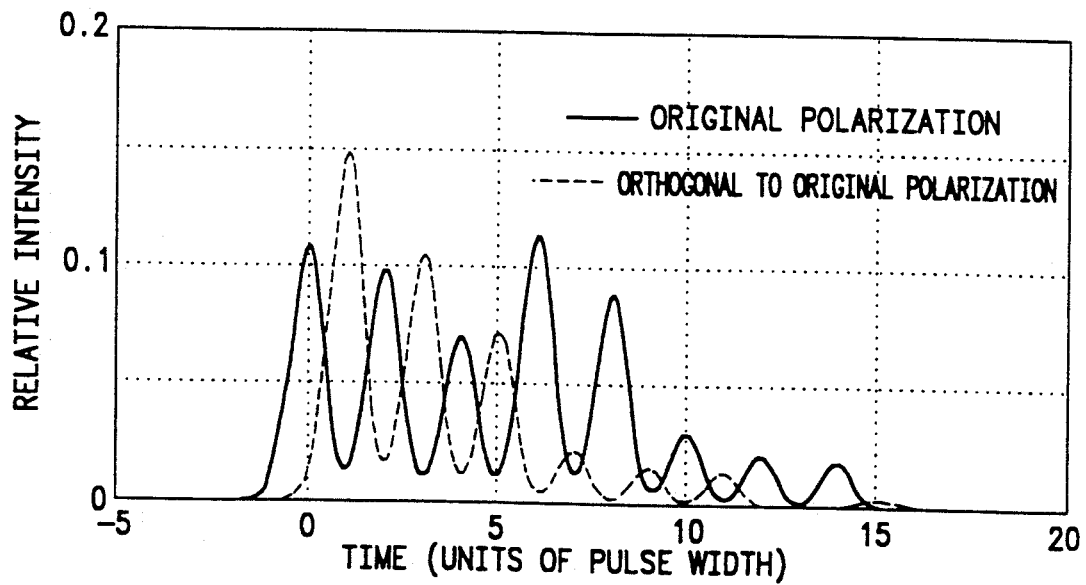
FIG. 5
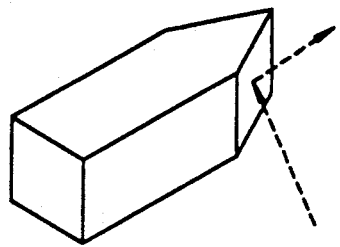
FIG. 7
```
③  ⑥  ⑨
②  ⑤  ⑧
①  ④  ⑦
```
FIG. 6

METHOD AND MEANS FOR REDUCING SPECKLE IN COHERENT LASER PULSES

BACKGROUND OF THE INVENTION

This invention relates generally to pulsed coherent lasers, and more particularly the invention relates to the reduction of speckle in coherent laser pulses such as used in microlithography in the fabrication of semiconductor integrated circuits.

Microlithography is used in the definition of circuit components in the fabrication of integrated circuits. With the advent of submicron line widths in circuit definition, both x-ray beams and laser beams have been employed for photoresist development. Eximer lasers have multiple spatial mode characteristics and high average power which is well suited for use in microlithography.

Coherent lasers possess many advantages over eximer lasers in microlithography due to the shorter wavelength and narrower spectral width. This leads to higher efficiency and smaller size. However, in coherent laser sources the "speckle" or random intensity distribution of light due to interference of highly coherent laser beams adversely affects the development of photoresist patterns in microlithography. In the ultraviolet regions, all presently available alternatives to eximer lasers are highly coherent pulsed laser systems, and currently proposed speckle reduction schemes work only for short coherent length laser systems or for wavelengths above the ultraviolet region.

The present invention is directed to an apparatus and method for reducing speckle in coherent laser pulses.

SUMMARY OF THE INVENTION

Accordingly, an object of the invention is the reduction of speckle in coherent laser pulses.

Another object of the invention is a method of providing coherent laser pulses especially useful in microlithography.

A feature of the invention is the use of optical means for producing from one laser pulse a plurality of laser pulses which are delayed and rotated in polarity to reduce pulse interference.

Another feature of the invention is the arrangement of an optical system whereby each pulse in a pulse train can exit the optical system in a slightly different position and at a slightly different angle. Thus, the speckle pattern produced by the interaction of the beam with scatterers is uncorrelated.

Still another feature of the invention is the implementation of the optical system in a single piece of fused silica.

Briefly, an optical system in accordance with the preferred embodiment of the invention includes an optical path having a beamsplitter for receiving and splitting a train of pulses, an output from the beamsplitter through which a first split pulse train can exit, and an optical path for delaying and rotating the polarization of another train of split pulses. The delayed pulse train is directed back to the beamsplitter and a portion of the delayed pulses pass through the output. However, due to polarization rotation between each original pulse and the delayed pulses, adjacent pulses exiting the output will not interfere.

A portion of the delayed pulse train is again passed through the optical path, delayed, rotated in polarization, and again directed to the beamsplitter where a portion of the pulse train passes through the output as a third train of output pulses.

In one embodiment of the invention the polarization rotation in the optical path is 90° whereby the first (original) pulse and a second, phase delayed and rotated pulse are orthogonal in polarization. A third pulse resulting from phase delay and rotation of a portion of the second pulse will have the same polarization as the first pulse, due to the two trips around the optical path. However, by making the delay of the third pulse greater than the laser coherence length, the first and third pulses will not interfere coherently with each other.

In another embodiment of the invention, the pulses can be directed to two beamsplitters each coupled to an optical path for delaying and polarization rotating portions of the beams thereby generating a longer train of non-interfering pulses from one original pulse.

In still another embodiment of the invention, mirrors in the optical path are arranged so that each pulse in the train exits the system in a slightly different position and at a slightly different angle whereby the speckled pattern produced by the interaction of the pulses with scatterers is uncorrelated.

The invention and objects and features thereof will be more readily apparent from the following detailed description and dependent claims when taken with the drawings.

BRIEF DESCRIPTION OF THE DRAWING

FIG. 1 is a schematic diagram of an optical system in accordance with one embodiment of the invention.

FIG. 2 illustrates a 90° polarization rotation using two 45° mirrors in the schematic of FIG. 1.

FIG. 3 is a schematic diagram of an optical system using two, cascaded optical paths of FIG. 1 in accordance with another embodiment of the invention.

FIG. 4 is a graph illustrating laser intensity versus time for pulses produced in the system of FIG. 1.

FIG. 5 is a graph illustrating laser intensity versus time for pulses produced in the system of FIG. 3.

FIG. 6 illustrates a pulse train pattern using the system of FIG. 3 in accordance with another embodiment of the invention.

FIG. 7 illustrates a cubic piece of fused silica.

DETAILED DESCRIPTION OF THE ILLUSTRATIVE EMBODIMENTS

Referring now to the drawing, FIG. 1 is a schematic diagram of an optical system in accordance with one embodiment of the invention. The apparatus includes a 45° beamsplitter 10 having a dielectric coating to yield 33% reflectance and 67% transmittance of input laser pulses. Thus, each input pulse produces one output pulse due to the reflectance of the beamsplitter, and the transmitted portion of the input pulse is passed to a 90° polarizer 12 which rotates the polarization of the input pulse and directs the pulse to a normal incidence mirror 14 which reflects the pulse back to beamsplitter 10. Upon reaching the beamsplitter the laser pulse has a polarization state 90° from the initial pulse, and the beamsplitter transmits 33% of the pulse and reflects 67% of the pulse back to the polarizer 12. The second input pulse from beamsplitter 10 thus has 22% ($0.22 = 0.67 \times 0.33$) of the total initial pulse energy and has a polarization orthogonal to the original laser pulse. Accordingly the first laser pulse output and the second laser pulse output are independent due to the orthogonal polarization thereof.

The pulse reflected by beamsplitter 10 back to the polarizer 12 will have its polarization rotated 90° to be the same as the original pulse polarization, and this pulse is then directed by mirror 14 back to beamsplitter 10 which transmits 67% of the original polarization to the output. Thus, the third output pulse, having the original polarization, has 30% of the total energy (0.30=0.67×0.67×0.67), and the three output pulses contain 85% of the total energy from the initial laser pulse (33%, 22%, 30%).

The first pulse possess 30% of the total pulse energy and has the original polarization, the second pulse possesses 22% of the total pulse energy and has polarization orthogonal to the original pulse, and the third pulse has 30% total pulse energy and has the original polarization. The second pulse will not coherently interfere with the first and third pulses since the electric field of the second pulse is orthogonal to the other two pulses. If the round trip path through polarizer 12 and mirror 14 back to beamsplitter 10 is greater than the laser coherence length, the first and third pulses will not interfere coherently with each other. Thus, the embodiment of the invention illustrated in FIG. can produce three independent pulses of roughly equal magnitude from a single laser pulse. This will reduce the speckle noise from a single pulse by $1/\sqrt{3}$ and reduce the required number of pulses by a factor of 3. In addition, 15% of the original pulse energy continues to circulate through the optical path and will create additional pulses albeit of lower energy content.

FIG. 2 illustrates one embodiment of the 45° polarization rotator 12 and comprises first and second 45° mirrors 12' and 12" which each rotate the polarization of a laser pulse by 45° and collectively provide the 90° polarization rotation.

In accordance with another embodiment of the invention, the output of the three pulse generating system of FIG. 1 can be passed through a second mirror and beamsplitter arrangement similar to FIG. 1 to create nine independent pulses for each input pulse. This embodiment is illustrated in FIG. 3 in which the optical system of FIG. 1 is illustrated at 20 and a second system is illustrated at 22. In the second system the round trip path length must be made three times that of the first system to separate all of the nine major pulses in time. Further cascading of the beamsplitter and mirror arrangement can produce still more independent laser pulses from a single input laser pulse. Power losses from the mirror surfaces and the laser coherence length limit the number systems that may be practically cascaded.

FIG. 4 is a graph illustrating the laser intensity versus time for the pulses generated in the system of FIG. 1. The solid line illustrates the original polarization of the first and third pulses, and the dotted line illustrates the second pulse having orthogonal polarization.

Similarly, FIG. 4 is a graph illustrating laser intensity versus time for the two cascaded mirror systems of FIG. 3 with the original polarization again indicated by a solid line and the orthogonal polarization pulses illustrated by dotted lines.

Further cascading of the three mirror system can produce still more independent laser pulses from a single input pulse. The effective number of laser pulses produced is approximately equal to $3^P$ where P is the number of cascaded system. There are two practical limitations on the number of three mirror systems that can be cascaded. First is the fact that each additional system must have a round trip distance three times that of the previous system. For lasers with long coherence lengths, this round trip distance can become impractically long. The second limitation is the imperfect reflections from each of the three mirrors. If the mirrors have reflectivity less than 100% there will be energy loss in each round trip made by the laser beam leading to low overall energy efficiency.

In accordance with another embodiment of the invention correlation between the first and third pulses, which have the same polarization, can be reduced by arranging the mirrors in the system of FIG. 1 so that each pulse in the train exits the system at a slightly different position and at a slightly different angle was illustrated (exaggerated by the clashed output in FIG. 1. Thus, the speckle pattern produced by the of the beam with scatterers will be uncorrelated. A resulting beam pattern by so arranging the mirrors for the system of FIG. 3 and the pulses illustrated in FIG. 5 is shown in FIG. 6. Since the nine pulses do not overlap the resulting speckle will be further reduced due to the uncorrelated positions of speckle in the pulses.

It is possible to significantly reduce the RMS speckle in a coherent-source system by means of high-speed rotating diffusers. Combining the optical system with such a diffuser would further smooth the illumination intensity. For example, with two four inch disks counter-rotating at 15,000 RPM the RMS noise is reduced to 60%, equivalent to about three pulses. Extrapolating to higher speeds and a finer diffuser pattern, noise can be reduced to about 33%, or an effective number of pulses equal to nine. This figure, combined with a single arm of the optical system of the invention results in an effective number of pulses equal to 27. With a 1000Hz laser, a 1% uniformity would be achieved with 370 pulses i.e. an exposure time of 0.37 seconds. This is a practical exposure time. If two arms of the invention are used, the exposure time (for 125 pulses) would be reduced to 0.125 seconds. Other speckle reduction schemes could be similarly combined with this invention.

The pulse generation system can be implemented in a single piece of fused silica. For a laser source with coherence lengths or pulse durations of only a few inches, the system can be fabricated in a reasonable sized cubic piece of fused silica, as shown in FIG. 7. The two 45 degree mirrors are replaced by total internal reflection at the inside surfaces of the fused silica cube. The normal incidence mirror is replaced by two total internal reflections aligned in a manner similar to a corner cube. The entire system alignment is then consist of positioning the cube properly relative to the incident laser beam.

There has been described a simple optical system which can greatly reduce the amount of speckle noise produced by a single laser pulse by creating a plurality of independent and uncorrelated pulses from each input laser pulse. By so reducing the speckle noise with a single laser pulse, the total number of laser pulses required is reduced and thus the system throughput is increased.

While the invention has been described with reference to specific embodiments, a description is illustrative of the invention and is not to be construed as limiting the invention. Various modifications and applications may occur to those skilled in the art without departing from the true spirit and scope of the invention as defined by the appended claims.

What is claimed is:

1. Apparatus for producing coherent laser pulses having reduced laser speckle noise for use in laser microlithography, said apparatus comprising:

means for generating input laser pulses having a first polarization and a predetermined laser coherency length;

first beamsplitter means positioned in the optical path of said input laserpulses for producing a first pulse train and a second pulse train therefrom, said first pulse train including a first series of output pulses of the first polarization in an output train; and first polarization rotating and delaying means positioned in the path of said second pulse train for delaying and polarization rotating said second pulse train and directing said second pulse train back to said beamsplitter means so that a second series and a third series of output pulses are produced in the output pulses along with said first series of output pulses, the polarization of said second series of output pulses being rotated with respect to said first series of output pulses, said third series of output pulses being delayed from said first series of output pulses corresponding to a length greater than the laser coherence length; whereby three series of output pulses are produced for each input pulse and the number of laser pulses is increased thereby reducing laser speckle noise.

2. The apparatus according to claim 1 wherein said beamsplitter means transmits approximately two-thirds of an input pulse and reflects approximately one-third of an input pulse.

3. Apparatus as defined by claim 1 wherein said polarization rotating and delaying means rotates the polarization of a pulse by 90°.

4. Apparatus as defined by claim 1 wherein said first beamsplitter means and said first polarization rotating and delaying means comprise a single piece of silica.

5. Apparatus as defined by claim 1 and further including second beamsplitter means positioned in the optical path of laser output pulses from said first beamsplitter means, and second polarization rotating and delaying means positioned in the path of transmitted laser pulses from said second beamsplitter means so that a second series and a third series of output pulses are produced in the output train from said second beamsplitter means along with a first series of output pulses, the polarization of the second series of output pulses being rotated with respect to the first series of output pulses, the third series of output pulses being delayed from the first series of output pulses corresponding to a length greater than the laser coherence length, whereby nine series of output pulses from said second beamsplitter means are produced for each input pulse to said first beamsplitter means.

6. Apparatus defined by claim 5 wherein each of said polarization rotating and delaying means include mirrors arranged so that each pulse in a pulse train exits the system in a slightly different position in a slightly different angle.

7. Apparatus as defined by claim 1 wherein said first polarization rotating and delaying means includes mirrors arranged so that each pulse of the output pulses exits the system at a slightly different position and at a slightly different angle.

8. A method of generating a train of coherent laser pulses with reduced speckle comprising the steps of:

(a) providing input laser pulses having a first polarization and a coherence length, (b) splitting each pulse of said input laser pulses to provide a first pulse train and a second pulse train, said first pulse train including a first series of output pulses of the first polarization in output pulses, (c) rotating polarization and delaying said second pulse train, (d) splitting said second pulse train to provide a second series of output pulses having a different polarization than said first series of output pulses and a third pulse train, (e) rotating polarization and delaying said third pulse train, (f) splitting said third pulse train to provide a third series of output pulses delayed from said first series of output pulses corresponding to a length greater than said coherent length, thereby generating a first train of coherent laser output pulses including said first series of output pulses interleaved with said second series of output pulses and said third series of output pulses.

9. The method as defined by claim 8 wherein step (c) and step (e) provide polarization rotation of 90°.

10. The method as defined by claim 8 wherein step (c) and step (e) include providing an optical path whereby pulses in said train of coherent laser output pulses have different positions and different angles compared to other pulses in said train of coherent laser output pulses.

11. The method as defined by claim 10 wherein step (b) through step (f) are repeated for said first train of coherent laser output pulses to thereby generate a second train of coherent laser output pulses.

12. The method as defined by claim 8 wherein step (b) through step (f) are repeated for said first train of coherent laser output pulses to thereby generate a second train of coherent laser output pulses.

13. Apparatus for use in producing coherent laser pulses having reduced laser speckle noise comprising:

first beamsplitter means positionable in the optical path of input laser pulses for producing a first pulse train and a second pulse train therefrom, said first pulse train including a first series of output pulses of the first polarization in an output train; and first polarization rotating and delaying means positioned in the path of said second pulse train for delaying and polarization rotating said second pulse train and directing said second pulse train back to said beamsplitter means so that a second series and a third series of output pulses are produced in the output pulses along with said first series of output pulses, the polarization of said second series of output pulses being rotated with respect to said first series of output pulses, said third series of output pulses being delayed from said first series of output pulses corresponding to a length greater than the laser coherence length; whereby three series of output pulses can be produced for each input pulse and the number of laser pulses is increased thereby reducing laser speckle noise.

14. Apparatus as defined by claim 13 wherein said first beamsplitter means and said first polarization rotating and delaying means comprise a single piece of silica.

* * * * *